US012615822B2

(12) United States Patent
Wang et al.

(10) Patent No.: US 12,615,822 B2
(45) Date of Patent: Apr. 28, 2026

(54) BODY CONTACT FET

(71) Applicant: SKYWORKS SOLUTIONS, INC.,
Irvine, CA (US)

(72) Inventors: Hailing Wang, Acton, MA (US);
Guillaume Alexandre Blin, Carlisle,
MA (US); David Scott Whitefield,
Andover, MA (US)

(73) Assignee: SKYWORKS SOLUTIONS, INC.,
Irvine, CA (US)

( * ) Notice: Subject to any disclaimer, the term of this
patent is extended or adjusted under 35
U.S.C. 154(b) by 754 days.

(21) Appl. No.: 17/810,358

(22) Filed: Jul. 1, 2022

(65) Prior Publication Data

US 2023/0009677 A1    Jan. 12, 2023

Related U.S. Application Data

(60) Provisional application No. 63/218,997, filed on Jul.
7, 2021.

(51) Int. Cl.
| | |
|---|---|
| *H10D 62/17* | (2025.01) |
| *H10D 30/60* | (2025.01) |
| *H10D 64/27* | (2025.01) |
| *H10D 86/00* | (2025.01) |

(52) U.S. Cl.
CPC ......... *H10D 62/378* (2025.01); *H10D 30/603*
(2025.01); *H10D 64/519* (2025.01); *H10D*
*86/201* (2025.01)

(58) Field of Classification Search
None
See application file for complete search history.

(56) References Cited

U.S. PATENT DOCUMENTS

| | | | | |
|---|---|---|---|---|
| 4,864,377 | A * | 9/1989 | Widdershoven ..... | H10D 62/378 |
| | | | | 257/E21.538 |
| 5,489,792 | A | 2/1996 | Hu et al. | |
| 10,410,957 | B2 | 9/2019 | Wang et al. | |
| 10,847,445 | B2 | 11/2020 | Wang et al. | |
| 2002/0145184 | A1 * | 10/2002 | Perugupalli ......... | H10D 84/401 |
| | | | | 257/213 |
| 2007/0034942 | A1 * | 2/2007 | Xu ...................... | H10D 64/111 |
| | | | | 257/329 |

(Continued)

FOREIGN PATENT DOCUMENTS

| | | |
|---|---|---|
| EP | 0566262 A2 | 10/1993 |
| TW | 201225298 A | 6/2012 |
| WO | 2017173322 A1 | 10/2017 |

OTHER PUBLICATIONS

Combined Search and Examination Report from corresponding
United Kingdom Application No. 2209684.6 dated Dec. 28, 2022.

*Primary Examiner* — Bilkis Jahan
(74) *Attorney, Agent, or Firm* — Lando & Anastasi, LLP

(57) ABSTRACT

A field-effect transistor (FET) and a radio-frequency module
are provided comprising an active region comprising a
source region, a drain region, a body region disposed
between the source region and the drain region, a first body
extension portion in contact with the body region, a second
body extension portion in contact with the body region, and
a body contact region in contact with the first extension
portion and the second extension portion; and a gate dis-
posed on a top surface of the body region. A die is also
provided comprising two or more such FETs.

18 Claims, 12 Drawing Sheets

(56) References Cited

U.S. PATENT DOCUMENTS

| | | | |
|---|---|---|---|
| 2008/0036009 A1 | 2/2008 | Vora | |
| 2008/0197411 A1* | 8/2008 | Korec | H10D 30/603 |
| | | | 257/133 |
| 2021/0066503 A1 | 3/2021 | Dutta et al. | |

* cited by examiner

BODY CONTACT FET

RELATED APPLICATIONS

This application claims priority to and the benefit of U.S. Provisional Application No. 63/218,997, filed Jul. 7, 2021, titled IMPROVED BODY CONTACT FET, which is incorporated in its entirety herein by reference.

BACKGROUND

Field

The present disclosure generally relates to field-effect transistor (FET) devices and more particularly to body contact arrangements for such FET devices.

Description of Related Art

In electronics applications, field-effect transistors (FETs) can be utilized as switches and in amplifiers. Switches can allow, for example, routing of radio-frequency (RF) signals in wireless devices. Amplifiers can amplify signals for transmission or amplify received signals.

FETs with a Metal-Oxide-Silicon (MOS) structure have an insulating oxide layer separating the gate-conductor and the body of the FET. Additionally, in a Silicon on Insulator (SOI) technology, an additional electrically insulating layer is buried under the body region and is termed a buried-oxide (BOX) layer.

In non-body contacted SOI devices, i.e., floating-body devices, the body portion is surrounded by the insulator layer beneath and the insulating layer above. Furthermore, due to the difference in doping type between the body region and the source region and drain region to either side, it becomes difficult to control the voltage of the body region because charges can accumulate within it that are slow to dissipate. One effect of this is that the voltage between gate and the body region, which determines whether the transistor is on or off, can depend upon the history of the previous states of the transistor. This is known as the "floating-body problem".

SUMMARY

According to a number of implementations, the present disclosure relates to a field-effect transistor (FET) that includes an active region comprising a source region, a drain region, a body region disposed between the source region and the drain region, a first body extension portion in contact with the body region, a second body extension portion in contact with the body region, and a body contact region in contact with the first extension portion and the second extension portion, and a gate disposed on a top surface of the body region.

In some embodiments the FET is a silicon on insulator field-effect transistor comprising an insulator layer beneath the active region and a substrate beneath the insulator layer. In some embodiments the insulator layer is a buried oxide layer.

In some embodiments the first body extension portion is unitary with the body region. In some embodiments the second body extension portion is unitary with the body region. In some embodiments the first body extension portion extends from the body region beneath the source region. In some embodiments the first body extension portion creates a first body extension layer beneath the source region. In some embodiments the first body extension portion further extends beneath the body contact region. In some embodiments the first body extension portion creates a second body extension layer beneath the body contact region.

In some embodiments the second body extension portion extends from the body region through the source region. In some embodiments the second body extension portion extends from the body region through the source region along an edge of the source region. In some embodiments the second body extension portion extends from the body region through the source region along through a middle portion of the source region, such that the source region is disposed on either side or both sides of the second body extension portion. In some embodiments the second body extension portion extends from the body region through the source region at a mid-point of the source region.

In some embodiments the gate extends over a top surface of the second body extension portion.

In some embodiments the FET further comprises a first silicide layer disposed on a top surface of the source region and the body contact region. In some embodiments the first silicide layer is a self-aligned silicide layer. In some embodiments the FET further comprises a second silicide layer disposed on a top surface of the drain region. In some embodiments the second silicide layer is a self-aligned silicide layer.

In some embodiments the FET is an extended drain field-effect transistor further comprising a drain extension region disposed between an upper portion of the body region and the drain region.

In some embodiments the active region comprises one or more notches adjacent to the gate. In some embodiments the second body extension portion comprises a plurality of second body extension sub-portions.

In some embodiments the body region, the first body extension portion and the second body extension portion comprise a semiconductor having a relatively weak doping of a first type, the body contact region has a relatively strong doping of the first type, and the source region and the drain region have a doping of a second type. In some embodiments the doping of the first type is N-type and the doping of the second type is P-type. In some embodiments the doping of the first type is P-type and the doping of the second type is N-type.

In some embodiments the gate comprises a polysilicon layer disposed on top of an insulator layer. In some embodiments the gate comprises a metal layer and a polysilicon layer disposed on top of an insulator layer. In some embodiments the insulator layer is an oxide layer. In some embodiments, the insulator layer is a layer with high-k dielectrics.

According to a number of implementations, the present disclosure relates to a die comprising a first and second FET, the first and second FET each comprising an active region comprising a source region, a drain region, a body region disposed between the source region and the drain region, a first body extension portion in contact with the body region, a second body extension portion in contact with the body region, and a body contact region in contact with the first extension portion and the second extension portion, and a gate disposed on a top surface of the body region.

In some embodiments the first and second field-effect transistors share a common body contact region. In some embodiments the body region of the first field-effect transistor and the body region of the second field-effect transistor are disposed on opposite sides of the common body contact region. In some embodiments the first and second field-effect transistors share a common second body extension portion. In some embodiments the first and second field-effect transistors share a common gate.

In some embodiments the die further comprises a third field-effect transistor and a fourth field-effect transistor wherein: the first and second field-effect transistors share a first common body contact region and are disposed on either side of the first common body contact region, the third and fourth field-effect transistors share a second common body contact region and are disposed on either side of the second common body contact region, and the first, second, third and fourth field-effect transistors share a common second body extension portion.

In some embodiments the first, second, third and fourth field-effect transistors share a common gate. In some embodiments the common gate has an "H" shape.

According to a number of implementations, the present disclosure relates to a radio-frequency module comprising: a packaging substrate configured to receive a plurality of devices, and a die mounted on the packaging substrate, the die including a field-effect transistor having an active region comprising a source region, a drain region, a body region disposed between the source region and the drain region, a first body extension portion in contact with the body region, a second body extension portion in contact with the body region, and a body contact region in contact with the first extension portion and the second extension portion; and a gate disposed on a top surface of the body region.

Embodiments disclosed herein address the floating-body problem and other problems. This may be done, in part, by providing devices with an improved body contact. Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

The headings provided herein, if any, are for convenience only and do not necessarily affect the scope or meaning of the claimed invention.

Disclosed herein are various examples related to body contacts for field-effect transistors (FETs). FETs, such as those having silicon on insulator (SOI) process technology, are utilized in many radio-frequency (RF) circuits, including those involving high performance, low loss, high linearity switches. In such RF switching circuits, performance advantage typically results from building a transistor in silicon, which sits on an insulator such as an insulating buried oxide (BOX) (such transistors are known as a silicon on insulator (SOI) transistors). The BOX typically sits on a handle wafer, typically silicon, but can be glass, borosilicon glass, fused quartz, sapphire, silicon carbide, or any other electrically-insulating material.

In various examples herein, FETs are sometimes described in the context of such SOI technology. However, it will be understood that one or more features of the present disclosure can also be implemented in other types of FETs.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. References to "top" and "bottom", as well as similar terms such as "above" and "below" are used simply to indicate a relative spatial position, and do not imply any absolute orientation or that the device must be oriented or used in a particular way.

Figure 1A:
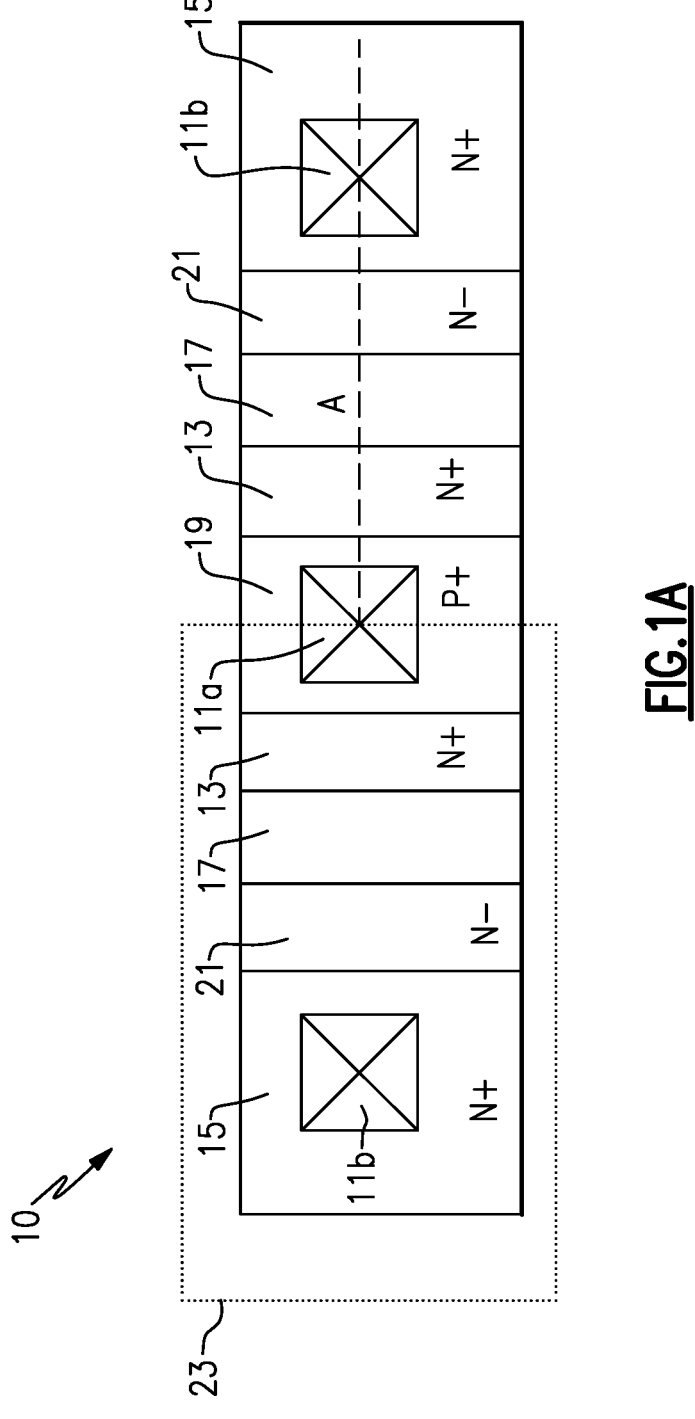
FIG. 1A is a plan view of a known prior-art die.
Figure 1B:
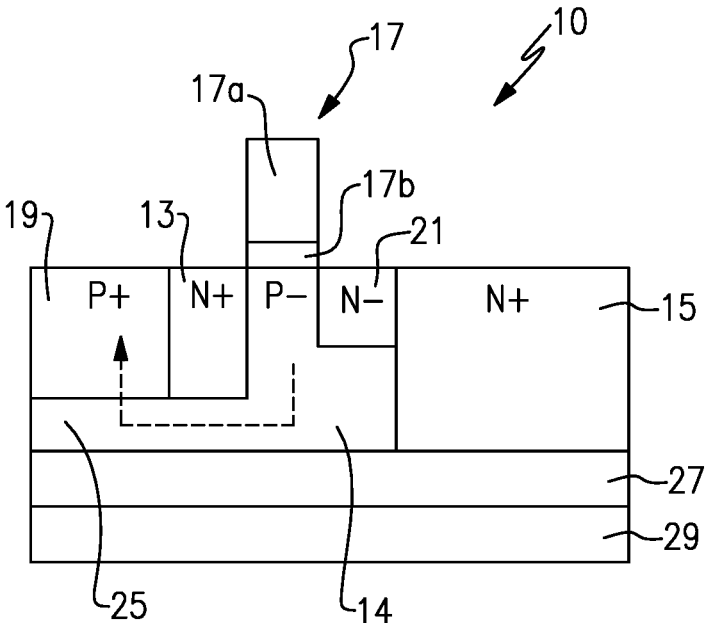
FIG. 1B is a cross section of the known prior-art die of FIG. 1 along line A.

In order that the invention be better appreciated, a known type of field-effect transistor (FET) will be described with reference to FIGS. 1A and 1B. FIG. 1A shows a plan view of a die 10 having an arrangement of two FETs of a known type. Box 23 illustrates the region on the die 10 occupied by one of the FETs. FIG. 1B shows a cross section of the die 10 along line A, which passes through one of the FETs of the die 10.

The prior art FETs, e.g., that enclosed by box 23, comprise an active region and a gate 17. The active region comprises a source region 13, a drain region 15 and a body region 14 disposed between the source region 13 and the drain region 15. The active region also comprises a body contact region 19 as well as a body extension portion 25 in contact with the body region 14 and the body contact region 19, as can be seen in FIG. 1B. Furthermore, the active region comprises a drain extension region 21 disposed between an upper portion of the body region 14 and the drain region 15. The gate 17 is disposed on top of the body region 14 and comprises a polysilicon layer 17a which is separated from the body region 14 by insulating layer 17b. Underneath the active region is an insulating layer 27 atop a substrate 29.

Charge carriers can pass from the body region 14 through the body extension portion 25 to the body contact region 19. However, as can be clearly seen in FIG. 1B, only a narrow path is provided by the body extension portion 25 between the source region 14 and the insulating layer 27, which contributes to the fact that the body contact of the prior art FETs of die 10 is only of limited effectiveness in overcoming the floating body effect.

Some or all of the embodiments disclosed herein may provide a device with an improved body contact. This can reduce or negate the floating-body problem and provide a device with a high breakdown voltage, which can allow application of the device in high power applications, such as power amplifiers and in particular high-power amplifiers. Furthermore, other characteristics of the transistor may be improved, including but not necessarily limited to the unity power gain frequency ($f_{max}$), the transition frequency ($f_t$), parasitic capacitances, linearity, and transconductance ($g_m$).

Figure 2A:
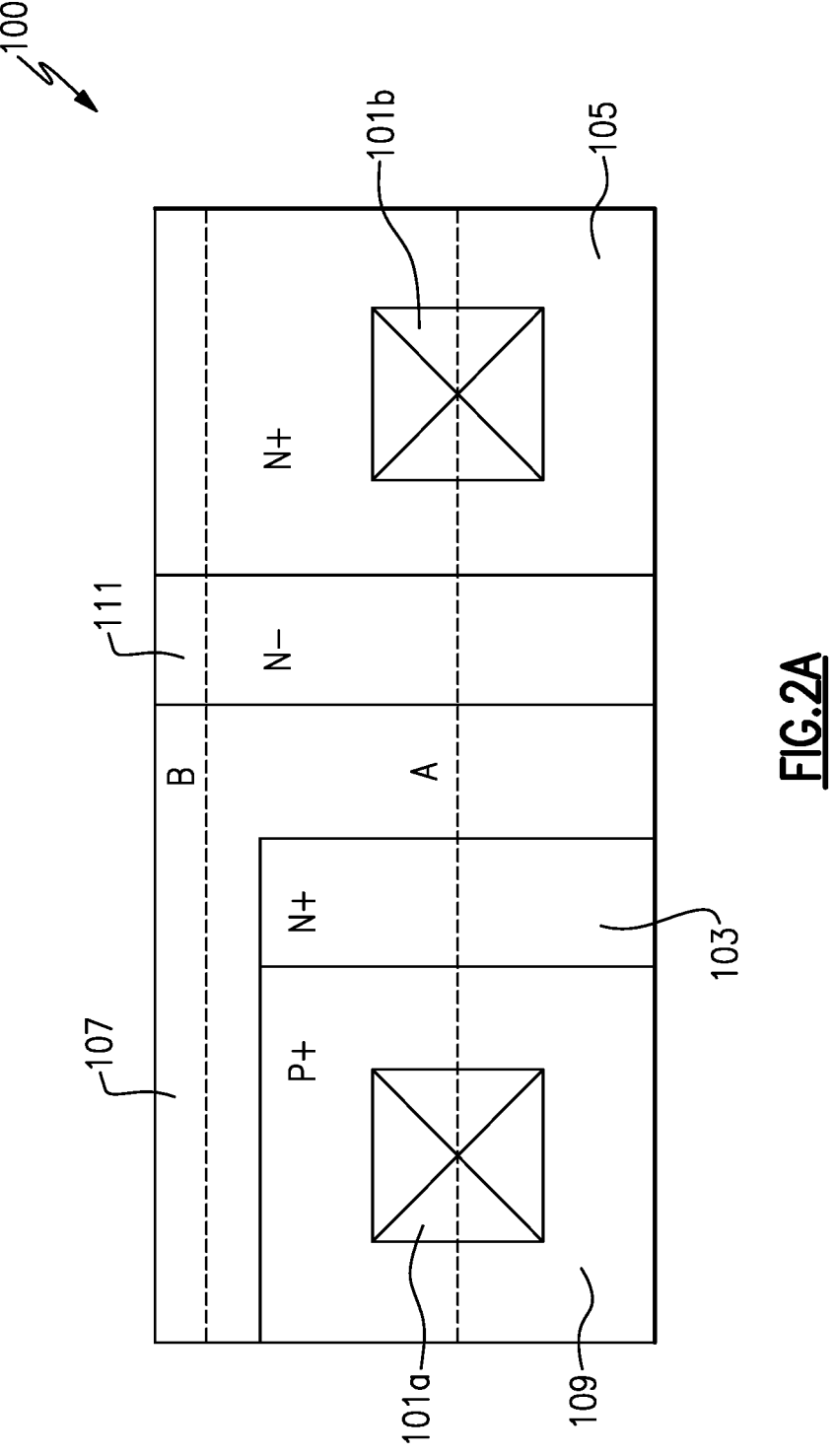
FIG. 2A is a plan view of a FET according to aspects of the present invention.
Figure 2C:
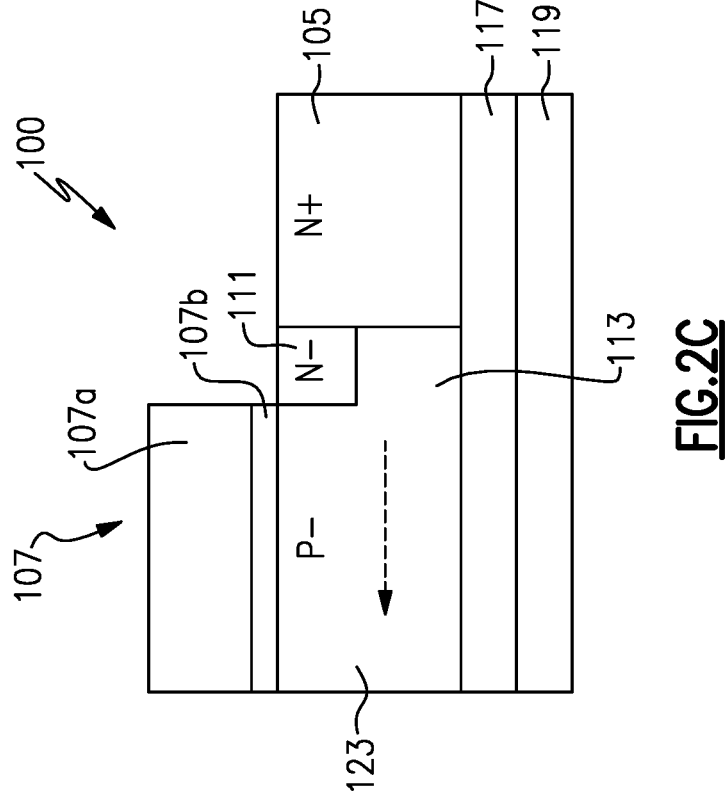
FIG. 2C is a cross section of the FET of FIG. 2A along line B.
Figure 2B:
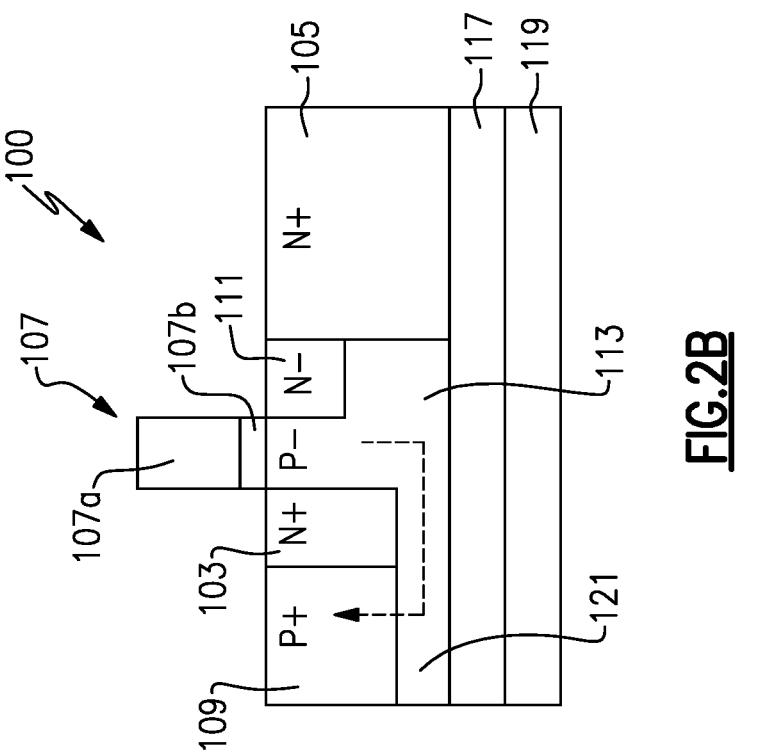
FIG. 2B is a cross section of the FET of FIG. 2A along line A.

FIG. 2A shows a plan view of a field-effect transistor (FET) 100, while FIG. 2B illustrates a cross section of FET 100 along line A marked in FIG. 2A, and FIG. 2C illustrates a cross section of FET 100 along line B marked in FIG. 2A. The FET 100 is a silicon on insulator (SOI) device in which an active region of the FET 100 is separated from a substrate 119 by an insulator layer 117, as shown in FIGS. 2B and 2C.

The FET 100 comprises an active region and a gate 107. The active region comprises a source region 103, a drain region 105 and a body region 113 disposed between the source region 103 and the drain region 105. The active region also comprises a body contact region 109 as well as a first body extension portion 121 and a second body extension portion 123, both body extension portions in contact with the body region 113 and the body contact region 109, as can be seen in FIGS. 2B and 2c. Furthermore, the active region comprises a drain extension region 111 disposed between an upper portion of the body region 113 and the drain region 105. The gate 107 is disposed on top of the body region 113 and comprises a polysilicon layer 107a which is separated from the body region 113 by insulating layer 107b.

The FET 100 may be integrated into an electrical circuit by making electrical connections with contacts 101. The contacts 101 include the source contact 101a and the drain contact 101b. In practice, the FETs will usually be provided with a silicide layer (not shown) between the relevant portions of the active region and the contacts 101 to provide a good electrical contact between the two. The silicide layer will often be a layer of self-aligned silicide, known in the art as salicide. This salicide layer has been omitted from the Figures for clarity and so that the structure of the active region is more apparent.

In operation, a voltage is applied between the source contact 101a and the drain contact 101b of the FET 100. The FET 100 is controlled between an open state (a state in which charge carriers can flow between the source and drain) and a closed state (a state in which charge carriers cannot flow between the source and the drain) by applying a voltage to the gate 107. This, in accordance with the well-known principles of field-effect transistors, creates an electrical field within the body region 113 which creates a channel through which the charge carriers can flow. The exact mechanism of operation depends upon the type of doping of the source region 103, the drain region 105 and the body region 113, but is well-known in the art in each case.

As noted above, the FET 100 illustrated in FIGS. 2A to 2C has a drain extension region 111 disposed between an upper portion of the body region 113 and the drain region 105. This further separates the source region 103 from the drain region 105 providing a higher breakdown voltage.

Connected to both the body region 113 and the body contact region 109 are the first body extension portion 121 and the second body extension portion 123. It should be noted that while the first body extension portion 121 and the second body extension portion 123 are described as being in contact with the body region 113, in practice they may be integral to, and unitary with, the body region 113. That is, there may be no boundary between the first body extension portion 121 and/or the second body extension portion 123 and the body region 113. Rather, the different components may be defined by their relationship with the other components of the FET 100. The first body extension portion 121 and the second body extension portion 123 may also be in contact with one another, or they may be separated from one another by another region of silicon.

The first body extension portion 121, the second body extension portion 123, the body region 113 and the body contact portion 109 all have a doping of the same type (though they may have a doping of different strengths, as discussed more below). This enables a good electrical connection between them (i.e., the body resistance of the transistor is reduced), in turn allowing charge carriers to pass from the body region 113 through the first body extension portion 121 and/or the second body extension portion 123 to the body contact region 109 as shown by the arrows in FIGS. 2B and 2c.

Looking at FIG. 2B, the first body extension portion 121 extends beneath the body contact region 109 to create a layer beneath the body contact region 109, separating the body contact region 109 from the insulator layer 117. This can provide a large contact surface between the body contact region 109 and the first body extension portion 121. However, in other embodiments, such as those discussed in relation to FIG. 6A, the first body extension portion 121 may only extend beneath the source region 103 to contact the body contact region 109, which extends down to the insulator layer 117. In other embodiments, the first body contact extension portion 121 may extend part-way underneath the body contact region 109, such that a bottom of the body contact region 109 has a stepped profile—the lower part contacting the insulator layer 117 and the upper part contacting the first body extension portion 121.

Turning now to FIG. 2C, the second body extension portion 123 extends through the entire depth of the active region—between the insulating layer 107b of the gate 107 to the insulator layer 117. Looking as well at FIG. 2A, the second body extension portion 123 extends along an edge of the FET 100, in this case a top edge. The gate 107 extends over, and covers, the second body extension portion 123. Hence, one can visualize the location of the second body extension portion 123 in the FET 100 in FIG. 2A by looking at the portion of the gate 107 that extends horizontally in the diagram along the top edge of the FET 100. It is thus apparent that the second body extension portion 123 is in contact with the body contact region 109 through the lower (as represented in FIG. 2A) side of the second body extension portion 123.

In the embodiment of FIGS. 2A to 2C, the second body extension portion 123 extends all the way to the end of the FET 100. This can provide a large contact surface between the body contact region 109 and the second body extension portion 123. However, in other embodiments, such as those discussed in relation to FIG. 3A, the second body extension portion 123 may only extend part of the way to the end of the FET 100. For example, in some embodiments the second body extension portion 123 can extend only through the source region 103 to contact the body contact region 109. In this case, the body contact region 109 will extend across the whole width of the FET. In some embodiments, the second body extension portion 123 can extend part of the way along the body contact region 109. In this case, the edge of the body contact region 109 can have a stepped profile—a wider part having a width equal to the width of the FET 100 and a narrower part wherein the second body extension portion 123 occupies a cut-out region of the body contact region 109.

As noted above, in the embodiments described in relation to FIGS. 2A to 2C, the second body extension portion 123 extends all the way to the end of the FET 100 along an edge of the FET 100. This layout can allow multiple such FETs 100 to be positioned side-by-side in an advantageous manner. Such a layout will be further discussed below in relation to FIG. 4. However, another embodiment will first be described again relating to a single FET in relation to FIGS. 3A, 3B and 3C.

Figure 3A:
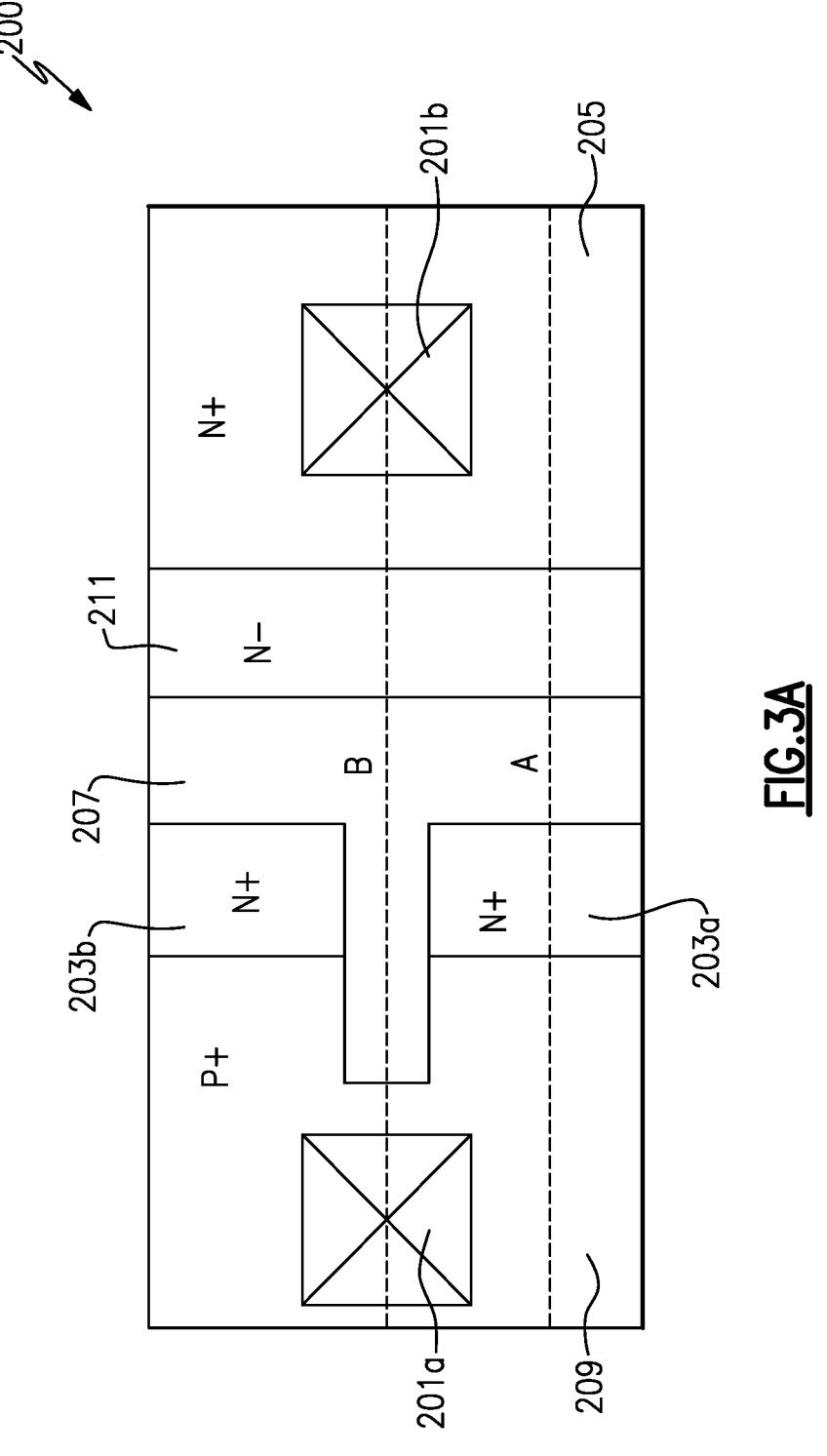
FIG. 3A is a plan view of a FET according to aspects of the present invention.
Figure 3C:
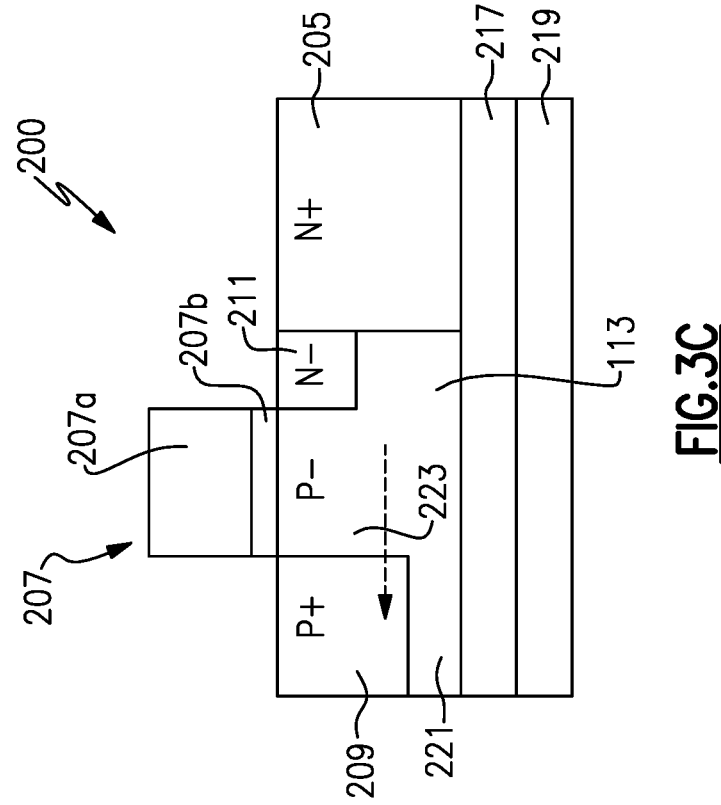
FIG. 3C is a cross section of the FET of FIG. 3A along line B.
Figure 3B:
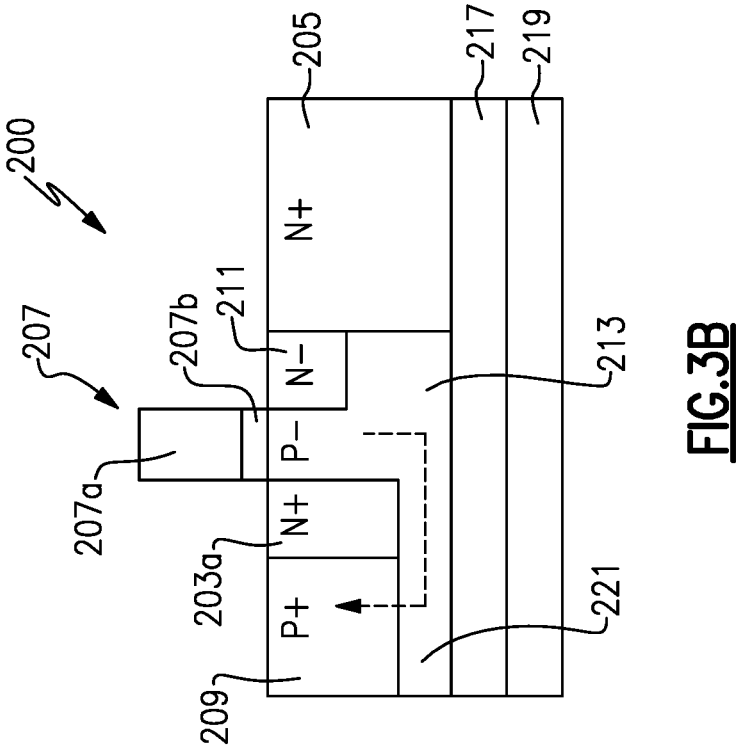
FIG. 3B is a cross section of the FET of FIG. 3A along line A.

FIG. 3A illustrates a FET 200 according to embodiments of the invention. FIG. 3B shows a cross section along line A of FIG. 3A, and FIG. 3C shows a cross section along line B of FIG. 3A. The FET 200 described in FIGS. 3A to 3C has many of the same features and functionality as the FET 100 of FIGS. 2A to 2C. The FET 200 comprises a substrate 219, an insulator layer 217, a drain region 205, a drain extension region 211, and contacts 201a, 201b similar to those of FET 100. For brevity, features and functions that are the same are not repeated here. Instead, the differences of FET 200 of FIGS. 3A to 3C over FET 100 of FIGS. 2A to 2C are highlighted and discussed in detail. It may be assumed that FET 200 has, or can have, any feature disclosed in relation to FET 100 that is not contradictory to the discussion of FET 200 below.

Looking firstly at FIG. 3A, the gate 207 of FET 200 differs from gate 107 of FET 100 in that gate 207 is a "T" shape, rather than an "L" shape. The gate 207 is disposed over the top surface of the body region 213 and the second body extension portion 223, as can be seen in FIG. 3C. Hence, this difference in gate shape between gate 207 and gate 107 reflects the different positioning of the second body extension portion 223 in FET 200, compared with FET 100 of FIG. 2A.

The second body extension portion 223 of FET 200 is positioned away from the edges of FET 200. The second body extension portion 223 extends from the body region 213 through a middle portion of the FET 200, passing through a middle portion of the source region 203 which, as can be seen in FIG. 3A, is split into two portions 203a, 203b.

As shown in FIGS. 3A and 3C, the second body extension portion 223 extends in between the source regions 203a, 203b and into a cut-out region of the body contact region 209, giving body contact region 209 a "U" shape when viewed from above, as in FIG. 3A. However, in some embodiments, the second body extension portion 223 extends only to the rear edge of the source region 203 (meaning that the body contact region 209 will have a rectangular shape when viewed from above), or the second body extension portion 223 extends all the way to an end of the FET 200 (meaning that the body contact region 209 will be split into two portions by the second body extension portion 223, in a similar manner to the source region 203).

With respect to FIG. 3B, the first body extension portion 221 is essentially the same as the first body extension portion 121 illustrated in FIGS. 2A to 2C. The first body extension portion 221 extends from the body region 213 underneath the source region 203a and underneath body contact region 209 to the end of the FET 200. Looking at FIG. 3C, the first body extension portion 221 extends further than the second body extension portion 223 away from the body region 213 towards the end of the FET 200. In some embodiments, however, the first body extension portion 221 and the second body extension portion 223 may extend an equal amount from the body region 213, and in some embodiments the second body extension portion 223 may extend further from the body region 213 than the first body extension portion 221.

Now that the layout of individual FETs according to embodiments of the invention has been discussed, arrangements of multiple FETs on a die will be discussed with reference to FIGS. 4, 5A to 5C, and 6A to 6C.

Figure 4:
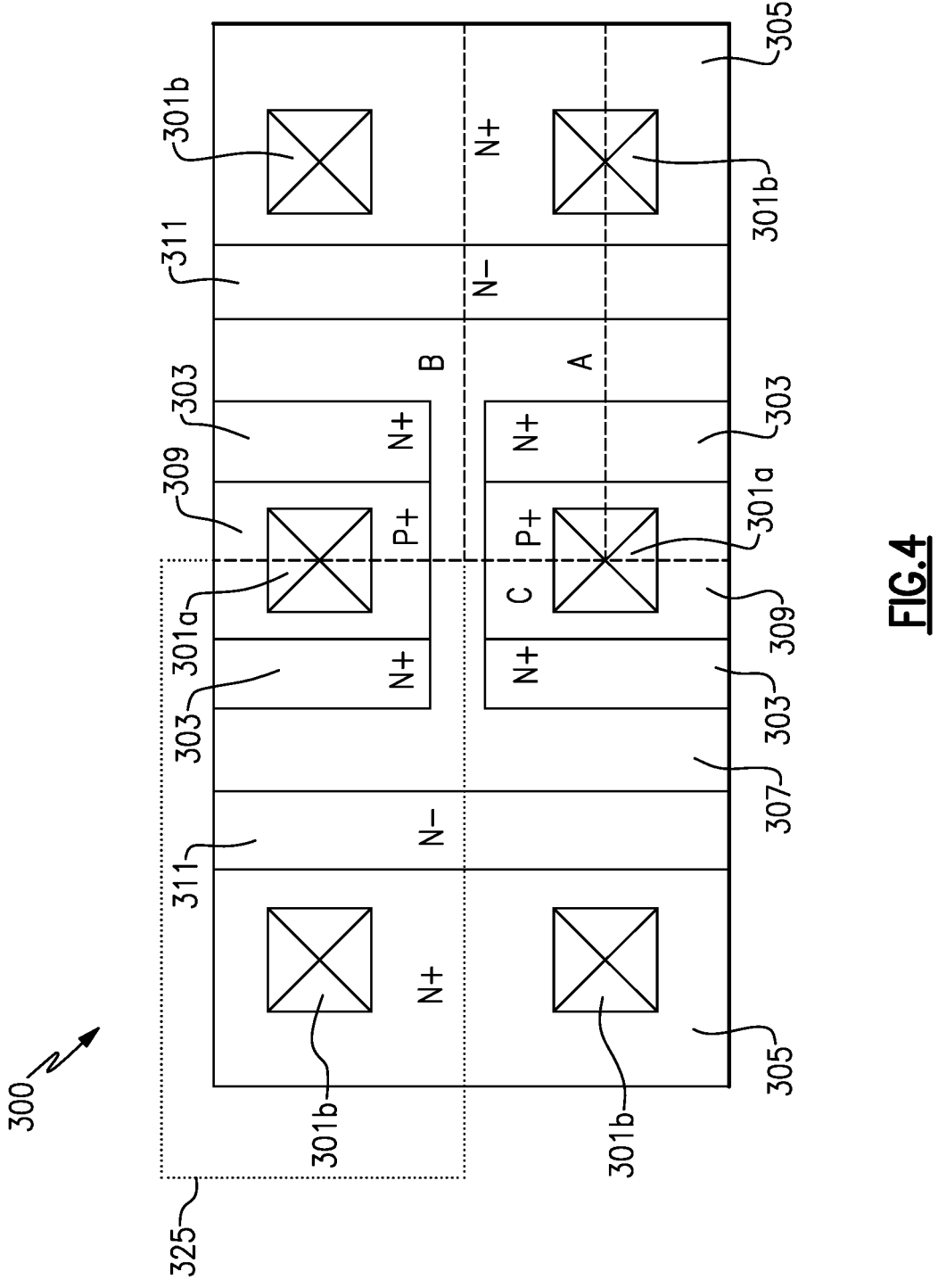
FIG. 4 is a plan view of a die according to aspects of the present invention.
Figure 5B:
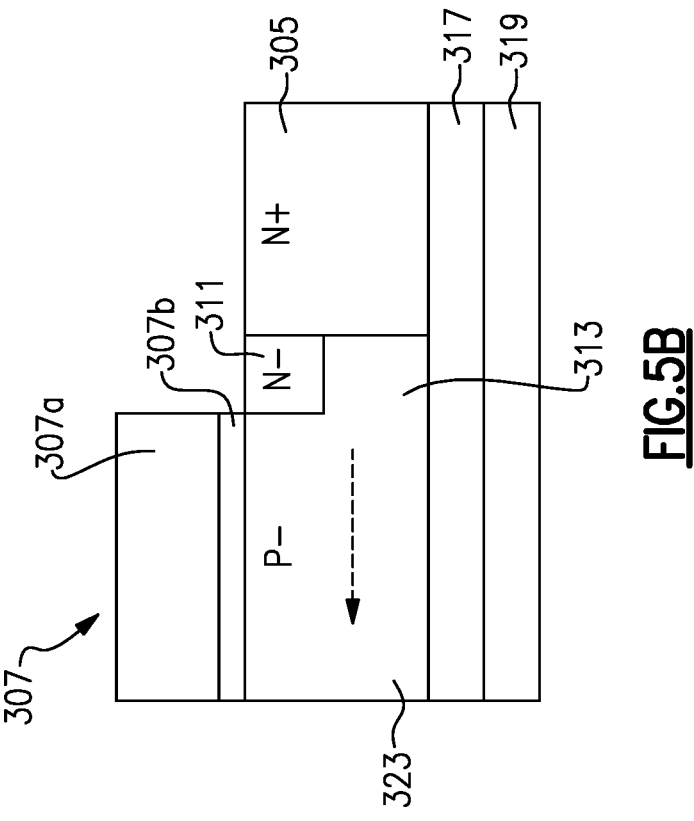
FIG. 5B is a cross section of a die in accordance with FIG. 4 along line B.
Figure 5A:
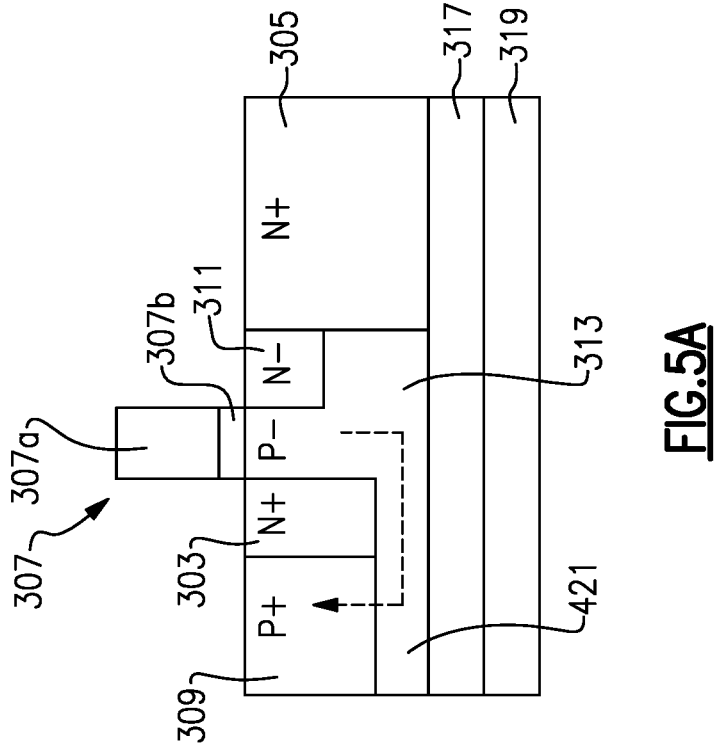
FIG. 5A is a cross section of a die in accordance with FIG. 4 along line A.
Figure 5C:
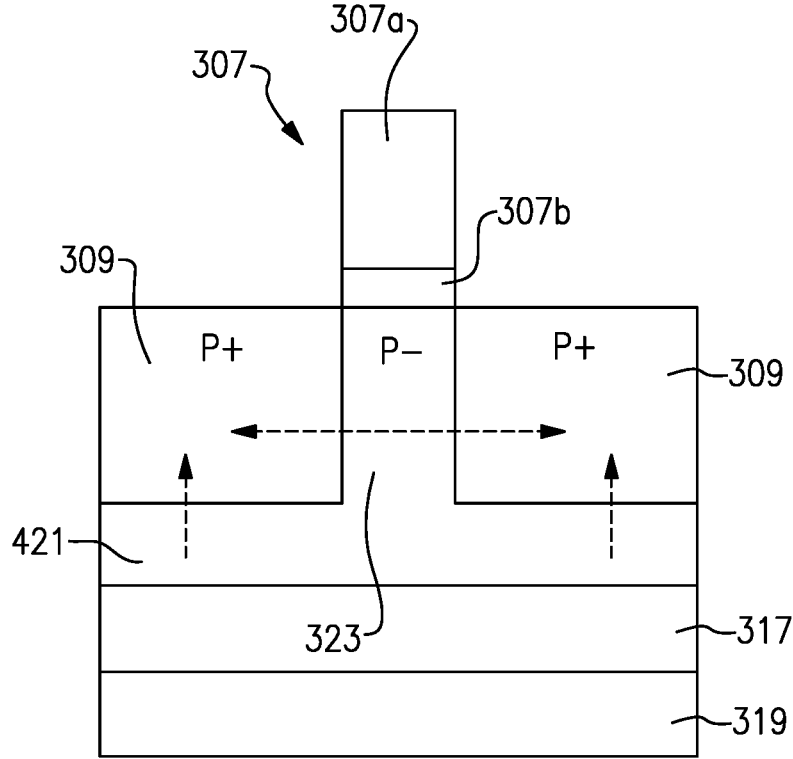
FIG. 5C is a cross section of a die in accordance with FIG. 4 along line C.
Figure 6B:
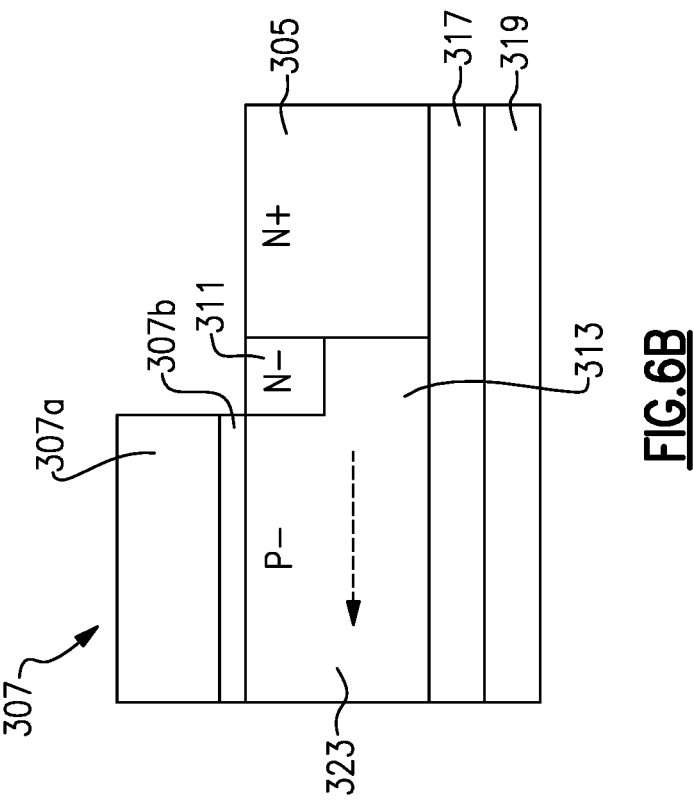
FIG. 6B is a cross section of a die in accordance with FIG. 4 along line B.
Figure 6A:
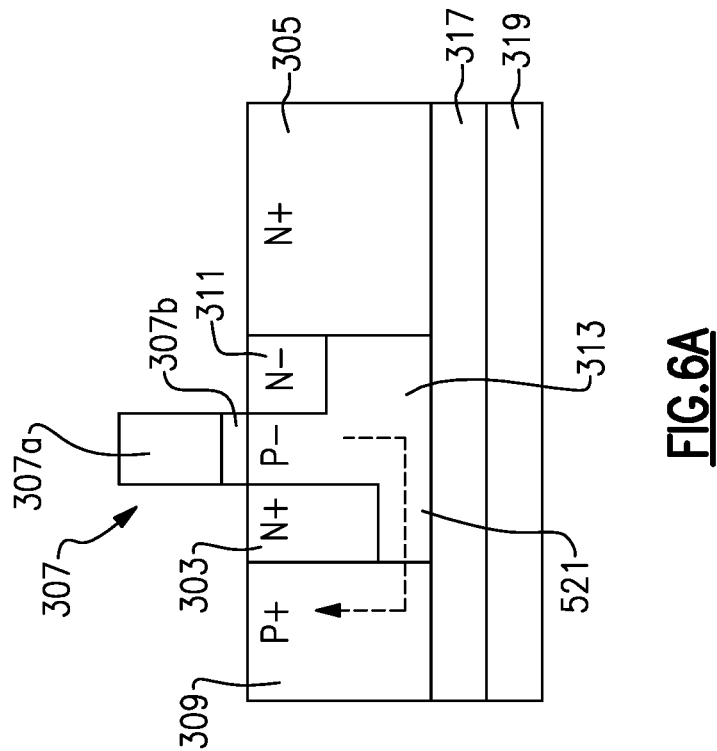
FIG. 6A is a cross section of a die in accordance with FIG. 4 along line A.
Figure 6C:
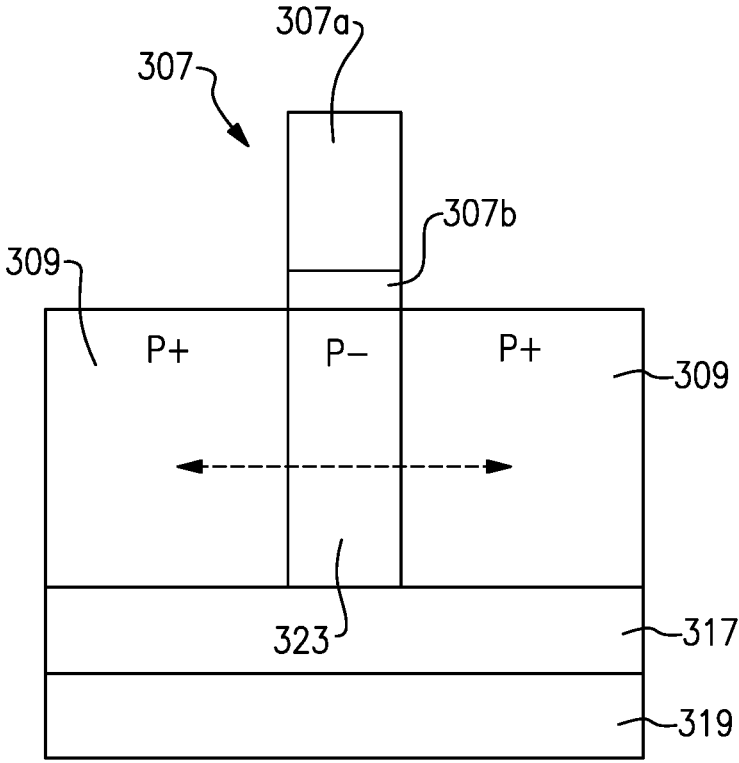
FIG. 6C is a cross section of a die in accordance with FIG. 4 along line C.

FIG. 4 shows a plan view of a die 300 comprising four FETs. FIGS. 5A, 5B and 5C represent cross sections along lines A, B and C of FIG. 4 respectively according to one embodiment, and FIGS. 6A, 6B and 6C represent cross sections along lines A, B and C of FIG. 4 respectively according to another embodiment.

Box 325 illustrates the region of die 300 occupied by one of the four FETs.

Looking at FIG. 4, there are two FETs adjacent to the FET enclosed by box 325, as well as a third FET diagonal and to the right of the FET enclosed by box 325. It will be appreciated that the FETs on the right are flipped relative to the FET of box 325 (i.e. the die 300 is symmetric about line C), and each pair of FETs in a left-right relationship share some common components. For example, the FET of box 325 and the FET to its right are flipped relative to one another and these two FETs have a common body contact region 309 and source contact 301a. The FETs on die 300 share a common gate 307 arranged in an "H" shape. As well as a line of symmetry along line C, the die 300 also has a line of symmetry along line B. That is, the two top FETs (including the FET of box 325) are a mirror image of the two lower FETs.

It will be appreciated that the FET of box 325 is similar to FET 100 illustrated in FIG. 2A. In fact, the FET of box 325 is a 180-degree rotation of FET 100. The other FETs of die 300 are also reflections or rotations of the FET 100 of FIG. 2A. The two FETs on the left are arranged along their edges having their second body extension portions touching; the two FETs on the right are arranged in a similar manner, as a reflection of the two FETs on the left; and the FETs on the left are arranged next to the FETs on the right such that the ends of each pair of second body extension portions meet.

While the die 300 illustrated in FIG. 4 comprises four FETs, it will be appreciated that a die could be provided comprising any number of the FETs disclosed herein, for example five, six, seven, or eight FETs, and so forth. In one embodiment a die may comprise multiples of four FETs, with each group of four FETs arranged in accordance with those of die 300 in FIG. 4. In a further embodiment, each group of four FETs may be arranged edge to edge such that the body contact regions 309, source regions 303, gates 307, drain extension regions 311, and drain regions 305 are aligned. In this case, the gate may have a ladder shape, formed from multiple "H" shaped gates, as per FIG. 4, with each multiple of four FETs positioned together.

FIGS. 5A to 5C and FIGS. 6A to 6C show cross sections of two different embodiments of die, each having the same plan view of that illustrated in FIG. 4. The embodiments of FIGS. 5A to 5C differ from the embodiment of FIGS. 6A to 6C at least in the differences between the first body extension portion 421 and the first body extension portion 521. The first body extension portion 421 has a different shape compared to the first body extension portion 521, as illustrated in FIGS. 5A to 5C and 6A to 6C, and as described in greater detail below. As in FIGS. 2B and 3B, the arrows illustrate the path taken by charge carriers from the body region 313 to the body contact region 309.

In FIG. 5A, the first body extension portion 421 extends underneath body contact region 309 all the way to the end of the FET (corresponding to the centerline of die 300, along line C). As in the embodiments of FIGS. 2A and 3A, the first body extension portion 421 forms a layer underneath the body contact region 309 between the body contact region 309 and the insulator layer 317. In FIG. 6A, the first body extension portion 521 extends only underneath source region 303, and the body contact region 309 extends all the way from the top surface of the active region down to the insulator layer 317.

FIGS. 5C and 6C show cross sections along line C in FIG. 4, that is, through the two source contacts 301a of the die 300. In FIG. 5C, first body contact region 421 can be see extending underneath body contact region 309. It will be appreciated that the left and right body contact regions 309 illustrated in FIG. 5C correspond to the upper and lower body contact regions 309 illustrated in FIG. 4 (i.e. the body contact regions 309 above and below the central bar of the "H" shaped gate 307). The second body extension portion 323 can be seen extending between the two body contact regions 309 underneath the horizontal portion (as illustrated in FIG. 4) of the gate 307. In FIG. 6C, however, the first body portion 521 cannot be seen as it does not extend to line C in FIG. 4. Rather, as illustrated in FIG. 6B, the first body portion 521 only extends underneath the source region 303 but not the body contact region 309. Hence, in FIG. 6C, only the second body extension portion 323 can be seen, extending between the body contact regions 309 as in FIG. 5C.

It will be noted that in both embodiments the cross section along line B in FIG. 4 is the same. That is, FIGS. 5B and 6B are identical.

Other modifications are contemplated to the FETs described herein. The source and/or regions may be notched.

That is, they have one or more cut-outs adjacent to the gate. Additionally or alternatively, the second body extension portion may also comprise a plurality of second body extension sub-portions, such as two sub-portions. These may extend the same or different amounts from the body region.

Throughout this application, the FETs have been illustrated with the source regions and drain regions having a high N-type doping (N+); the drain extension regions having a low N-type doping (N−); the body regions, the first body extension portions and the second body extension portions having a low P-type doping (P−); and the body contact regions having a high P-type doping (P+). It will be understood that the terms high and low doping are relative terms, indicating a relative strength of the doping as compared to other portions of the FET having a doping of the same type. For example, a body region having a low P-type doping and a body contact region having a high P-type doping does not imply any absolute limits on the strength of the doping in these regions, but merely indicates that the body contact region has a stronger doping than the body region. The doping strengths may include what is conventionally known as weak doping (often referred to as P−, N−), strong doping (often referred to as P+, N+), as well as other doping strengths such as extremely strong (often referred to as P++, N++). A FET with this doping arrangement is known as an N-type device, though it will be appreciated that the principles disclosed herein can be equally applied to P-type devices.

That is, the FETs described herein may have a body region, a first body extension portion and a second body extension portion comprise silicon having a relatively weak doping of a first type; a body contact region has a relatively strong doping of the first type; and a source region and the drain region have a doping of a second type. In some instances the doping of a first type will be a P-type doping and the doping of a second type will be a N-type doping, whilst in other instances the doping of a first type will be a N-type doping and the doping of a second type will be a P-type doping.

It should also be noted that whilst the FETs and dies disclosed herein have been described having a number of different "portions" or "regions", this should not be interpreted to mean that there is necessarily a physical boundary or separation between neighboring portions or regions except where the skilled person understands these to be necessary in accordance with the known principles of FETs. Furthermore, the portions or regions may be created in situ in, or on, a silicon wafer; layered on top of a silicon wafer or other substrate, etched from a silicon wafer or some combination of the thereof. The FETs and dies disclosed herein may be manufactured using standard techniques known to the person skilled in the art. Furthermore, while the FETs and dies disclosed herein have generally been described as being made from silicon, other semiconductors could be used instead, as will be appreciated by one skilled in the art. For example, the transistors could be implemented on a semiconductor wafer other than silicon, such as, but not limited to, gallium arsenide (GaAs). The functional regions of the transistor (the source, drain, etc.) may also be formed from semiconductors other than silicon.

Figure 7:
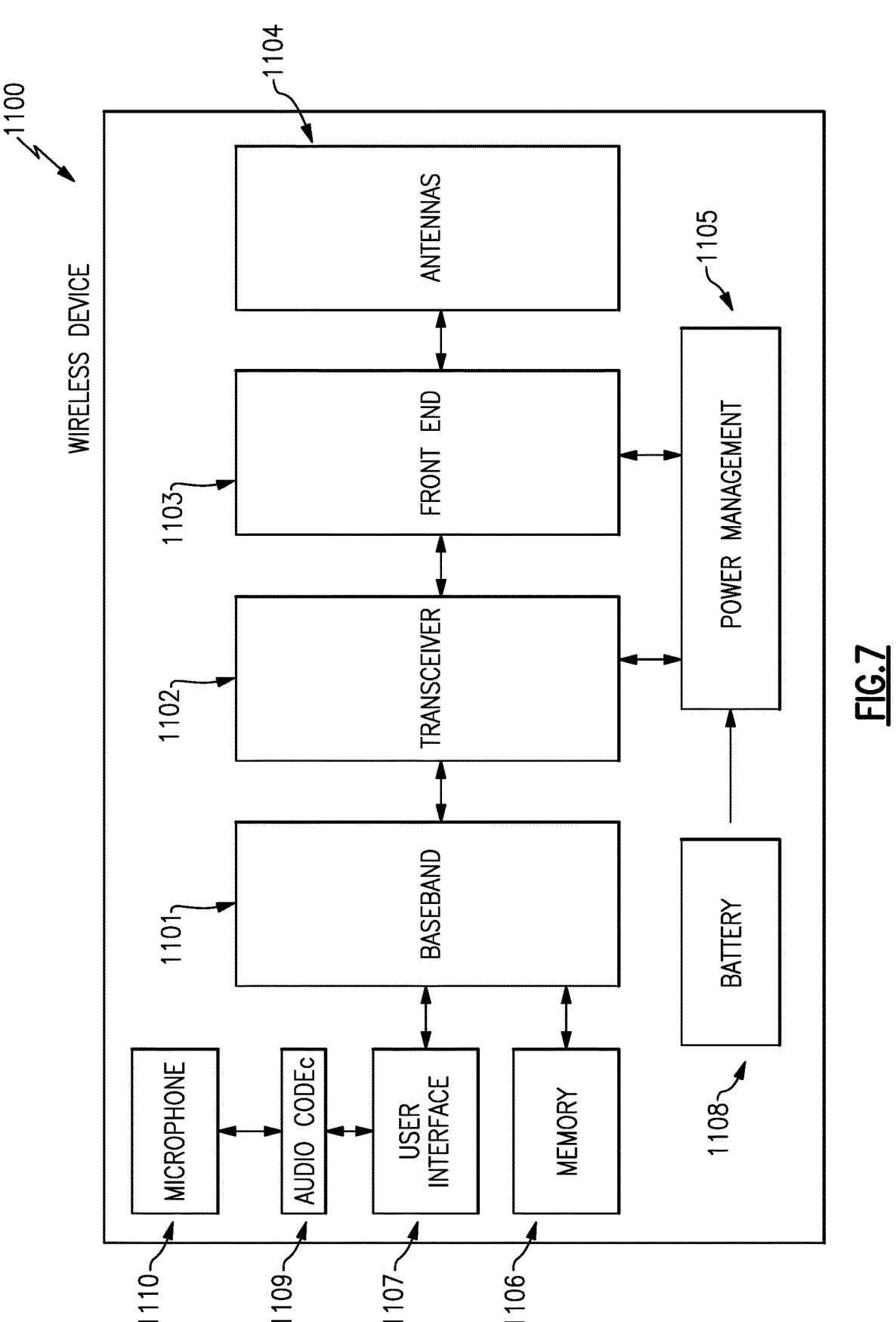
FIG. 7 is a schematic of a wireless device incorporating aspects of the present invention.

FIG. 7 is a schematic diagram of a wireless device 1100 that can incorporate aspects of the invention. The wireless device 1100 can be any device that uses FETs to perform any function. In FIG. 7, the wireless device 1100 is a portable telecommunication device such as a mobile cellular-type telephone. The wireless device 1100 can include a microphone arrangement 1110, and may include one or more of a baseband system 1101, a transceiver 1102, a front end module 1103, one or more antennas 1104, a power management system 1105, a memory 1106, a user interface 1107, a battery 1108, and/or an audio codec 1109. The microphone arrangement 1110 may supply signals to the audio codec 1109 which may encode analog audio as digital signals or decode digital signals to analog. The audio codec 1109 may transmit the signals to a user interface 1107. The user interface 1107 transmits signals to the baseband system 1101. The transceiver 1102 generates RF signals for transmission and processes incoming RF signals received from the antennas. The front end module 1103 aids in conditioning signals transmitted to and/or received from the antennas 1104. The antennas 1104 can include antennas used for a wide variety of types of communications. For example, the antennas 1104 can include antennas 1104 for transmitting and/or receiving signals associated with a wide variety of frequencies and communications standards. The baseband system 1101 is coupled to the user interface to facilitate processing of various user input and output, such as voice and data. The baseband system 1101 provides the transceiver 1102 with digital representations of transmit signals, which the transceiver 1102 processes to generate RF signals for transmission. The baseband system 1101 also processes digital representations of received signals provided by the transceiver 1102.

As shown in FIG. 7, the baseband system 1101 is coupled to the memory 1106 to facilitate operation of the wireless device 1100. The memory 1106 can be used for a wide variety of purposes, such as storing data and/or instructions to facilitate the operation of the wireless device 1100 and/or to provide storage of user information. The power management system 1105 provides a number of power management functions of the wireless device 1100. The power management system 1105 receives a battery voltage from the battery 1108. The battery 1108 can be any suitable battery for use in the wireless device, including, for example, a lithium-ion battery.

The FETs described herein in accordance with the present invention may be incorporated into any aspect of the wireless device 1100 of FIG. 7, including but not limited to the baseband system 1101, the transceiver 1102, the front end module 1103, the power management system 1105 and the memory 1106.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A field-effect transistor comprising:

an active region comprising a source region, a drain region, a body region disposed between the source region and the drain region, a first body extension portion in contact with the body region, a second body extension portion in contact with the body region, and a body contact region in contact with the first body extension portion and the second body extension portion, the source region and the body contact region being in contact with each other, the body contact region having a first side in contact with the first body extension portion, a second side in contact with the second body extension portion, and a third side in contact with the source region, and the source region having a first side in contact with the first body extension portion, a second side in contact with the second body extension portion, and a third side in contact with the body region; and a gate disposed on a top surface of the body region.

2. The field-effect transistor of claim 1 wherein the field-effect transistor is a silicon on insulator field-effect transistor having an insulator layer beneath the active region and a substrate beneath the insulator layer.

3. The field-effect transistor of claim 1 wherein the first body extension portion is unitary with the body region.

4. The field-effect transistor of claim 1 wherein the second body extension portion is unitary with the body region.

5. The field-effect transistor of claim 1 wherein the first body extension portion extends from the body region beneath the source region.

6. The field-effect transistor of claim 5 wherein the first body extension portion further extends beneath the body contact region.

7. The field-effect transistor of claim 1 wherein the second body extension portion extends from the body region through the source region.

8. The field-effect transistor of claim 7 wherein the second body extension portion extends from the body region through the source region along an edge of the source region.

9. The field-effect transistor of claim 7 wherein the second body extension portion extends from the body region through the source region along through a middle portion of the source region, such that the source region is disposed on both sides of the second body extension portion.

10. The field-effect transistor of claim 1 wherein the gate extends over a top surface of the second body extension portion.

11. The field-effect transistor of claim 1 wherein the field-effect transistor is an extended drain field-effect transistor, the active region having a drain extension region disposed between an upper portion of the body region and the drain region.

12. The field-effect transistor of claim 1 wherein the active region comprises one or more notches adjacent to the gate.

13. The field-effect transistor of claim 1 wherein:

the body region, the first body extension portion and the second body extension portion comprise a semiconductor having a relatively weak doping of a first type;

the body contact region has a relatively strong doping of the first type; and the source region and the drain region have a doping of a second type.

14. A die comprising a first and second field-effect transistor, the first and second field-effect transistor each comprising:

an active region comprising a source region, a drain region, a body region disposed between the source region and the drain region, a first body extension portion in contact with the body region, a second body extension portion in contact with the body region, and a body contact region in contact with the first body extension portion and the second body extension portion;

a third field-effect transistor and a fourth field-effect transistor, the first and second field-effect transistors sharing a first common body contact region and being disposed on either side of the first common body contact region, the third and fourth field-effect transistors sharing a second common body contact region and being disposed on either side of the second common body contact region, and the first, second, third and fourth field-effect transistors sharing a common second body extension portion; and a gate disposed on a top surface of the body region.

15. The die of claim 14 wherein the first and second field-effect transistors share a common body contact region.

16. The die of claim 15 wherein the body region of the first field-effect transistor and the body region of the second field-effect transistor are disposed on opposite sides of the common body contact region.

17. The die of claim 14 wherein the first and second field-effect transistors share a common second body extension portion.

18. The die of claim 14 wherein the first, second, third and fourth field-effect transistors share a common gate.

\* \* \* \* \*